United States Patent [19]

Maeda et al.

[11] Patent Number: 5,620,523

[45] Date of Patent: Apr. 15, 1997

[54] APPARATUS FOR FORMING FILM

[75] Inventors: Kazuo Maeda; Kouichi Ohira; Yuhko Nishimoto, all of Tokyo, Japan

[73] Assignees: Canon Sales Co., Inc.; Alcan-Tech Co., Inc.; Semiconductor Process Laboratory Co., Ltd., all of, Japan

[21] Appl. No.: 389,791

[22] Filed: Feb. 16, 1995

[30] Foreign Application Priority Data

Apr. 11, 1994 [JP] Japan ................................. 6-072017

[51] Int. Cl.⁶ .................................................. C23C 16/00
[52] U.S. Cl. .............. 118/723 IR; 118/71; 118/723 ER; 118/723 ME; 118/723 I; 204/298.07
[58] Field of Search .......................... 118/723 IR, 723 I, 118/723 AN, 723 ER, 723 ME, 715; 204/298.07; 315/111.51

[56] References Cited

U.S. PATENT DOCUMENTS

| | | | |
|---|---|---|---|
| H566 | 1/1989 | Nyaiesh | 427/38 |
| 4,050,408 | 9/1977 | Beucherie | 118/49.1 |
| 4,421,786 | 12/1983 | Mahajan | 427/82 |
| 4,641,603 | 2/1987 | Miyazaki et al. | 118/724 |
| 4,664,747 | 5/1987 | Sekiguchi | 156/643 |
| 4,828,369 | 5/1989 | Hotomi | 250/357 |
| 4,971,832 | 11/1990 | Arai | 427/39 |
| 5,018,479 | 5/1991 | Markunas | 118/723 IR |
| 5,020,200 | 6/1991 | Mimasaka et al. | 29/25.01 |
| 5,091,049 | 2/1992 | Campbell | 156/643 |
| 5,122,251 | 6/1992 | Campbell | 204/298.06 |
| 5,180,435 | 1/1993 | Markunas | 118/723 IR |
| 5,425,810 | 6/1995 | Conti et al. | 118/715 |
| 5,429,070 | 7/1995 | Campbell | 118/723 R |
| 5,436,528 | 7/1995 | Paranjpe | 315/111.51 |

FOREIGN PATENT DOCUMENTS

| | | |
|---|---|---|
| A0424256 | 4/1991 | European Pat. Off. . |
| A2677841 | 12/1992 | France . |
| 52-60570 | 5/1977 | Japan ..................................... 118/715 |
| 58-197724 | 11/1983 | Japan ..................................... 188/728 |
| 61-64124 | 4/1986 | Japan .................................. 118/723 IR |
| 368773 | 3/1991 | Japan . |
| 61-174376 | 8/1991 | Japan .................................. 118/723 IR |
| 5-78838 | 3/1993 | Japan ................................. 204/298.07 |
| 5-148634 | 6/1993 | Japan ................................. 204/289.07 |
| 5-243155 | 9/1993 | Japan ................................. 204/298.07 |
| 59-193904 | 11/1994 | Japan .................................. 118/723 IR |

OTHER PUBLICATIONS

P.C. Karr, Vacuum Deposition of Material Films on Substrates Utilizing Controlled Plasma, IBM Technical Disclosure Bulletin, vol. 19, No. 5, Oct. 1976.

Patent Abstracts of Japan, vol. 12, No. 082 15 Mar. 1988.

*Primary Examiner*—Richard Bueker
*Assistant Examiner*—Jeffrie R. Lund
*Attorney, Agent, or Firm*—Lorusso & Loud

[57] ABSTRACT

This invention relates to film-forming apparatus for forming an insulating film, for example, by the CVD method using an activated reaction gas. It is aimed at simplifying the apparatus, ensuring high film quality, enhancing the efficiency of formation of a plasma, and improving the uniformity of thickness of the produced film. The film-forming apparatus includes a plasma generator and a first gas discharger for discharging a first reaction gas into the plasma generator and a second gas discharger for discharging a second reaction gas onto a substrate. The second gas discharger includes a plurality of gas discharge pipes, in each of which a plurality of gas discharge holes are formed, whereby the second reaction gas is discharged from the gas discharge holes into contact with the activated first reaction gas and is itself activated so that a film is formed on the substrate through reaction of first and second reaction gases.

18 Claims, 6 Drawing Sheets

APPARATUS FOR FORMING FILM

BACKGROUND OF THE INVENTION

1. Field of the Invention

This invention relates to an apparatus for forming a film, and more specifically to a film-forming apparatus which is adapted to produce an insulating film, for example, by the CVD (chemical vapor deposition) method using an activated reaction gas.

2. Description of the Prior Art

In the manufacture of semiconductor devices, CVD devices are useful for the formation of $SiO_2$ film, PSG film, BSG film, BPSG film, $Si_3N_4$ film, amorphous Si film, polycrystalline Si film, W film, Mo film, $WSi_2$ film, $MoSi_2$ film, and Al film.

The conventional CVD devices are classified, in accordance with the means employed to activate the reaction gas, into the following three main types:

(1) Thermal CVD devices (2) Photo-assisted CVD devices (3) Plasma enhanced CVD devices The thermal CVD devices are provided with heating means for heating a reaction gas thereby imparting thermal energy to the reaction gas and activating it and maybe further classified by the pressure used, as either the low pressure type or the atmospheric pressure type. Also, according to the temperature of the substrate, they are classified as either the low or high temperature type. Further, in accordance with the means of heating, they are classified as resistance heating, induction heating, or lamp heating type. In accordance with location of installation of the heating means, they are classified as either a hot wall or a cold wall type.

The photo-assisted CVD devices are furnished with light emitting means for irradiating a reaction gas with ultraviolet light to impart light energy to the reaction gas and to thereby activate it and are capable of forming a film under low or high pressure, at a low temperature.

The plasma enhanced CVD devices have plasma-forming means for directly or indirectly activating a reaction gas by means of AC electric power or a magnetic field and are generally operated under a low pressure and at a low temperature. Conventional types of plasma-forming apparatus include the parallel plate type for directly activating a reaction gas by irradiation with high frequency energy and the ECR type for indirectly activating a reaction gas by means of electrons to which energy has been imparted by high frequency electric power and a magnetic field.

Film-forming with a thermal CVD device at times proves undesirable because the substrate is heated to a high temperature. Further, it is in need of improvement in providing qualities such as film density.

The method for forming a film by the photo-assisted CVD device produces the film on surfaces extraneous to the substrate and gives rise to formation of particles. Further, it has such a low deposition rate as to necessitate improvement for actual use.

The method for forming a film by the plasma enhanced CVD device, particularly the parallel plate type, entails irradiation of a substrate with the plasma which creates a possibility of damage to the substrate. In cases where the damage to the substrate poses a particular problem, the plasma enhanced CVD method of the ECR type is adopted instead. This method is indeed effective in precluding damage to the substrate and in formation of a film of high density. Since it uses an extremely high frequency, on the order of 2.45 GHz, the device used by this method is inevitably very large.

Particularly, in the plasma enhanced CVD device, the shape of the inlet pipe for the film-forming gas and the location of the gas discharge orifice inside the chamber constitute important factors from the viewpoint of heightening the efficiency of plasma formation or improving uniformity of the film thickness and otherwise enhancing the uniformity of the film.

SUMMARY OF THE INVENTION

The object of this invention is to provide a film-forming apparatus which is simple in construction and is capable of forming an insulating film of high quality and efficiency of plasma formation, while improving uniformity of film thickness and otherwise enhancing the uniformity of the film.

In the film-forming apparatus according to this invention, the electromagnetic field for the conversion of a gas into a plasma is effectively applied to a first reaction gas because a first gas inlet device communicates with the housing of a plasma-forming chamber in the central part of the upstream side of the plasma-forming chamber or is disposed in the central part of the plasma-forming chamber. This apparatus, therefore, enjoys high efficiency of plasma formation.

This apparatus is further capable of accelerating the conversion of the reaction gas into the plasma because the distance of travel of the reaction gas is increased by causing the first reaction gas which has been discharged to be received on a relay plate and then redirected for movement along the surface of the relay plate. As a result, the efficiency of plasma formation is improved.

The reaction gas is uniformly supplied onto the substrate because the gas discharge port(s) of the gas inlet device is disposed above the substrate. The uniformity of the film thickness, therefore, is improved.

Since the gas discharger is formed in an annular shape, it allows easy passage therethrough of the plasma which enters the upstream end of the film-forming chamber after having been constricted into a central region of the film-forming chamber by means such as a magnetic field, for example.

The CVD device is provided with an external antenna for radiating energy at a frequency of 13.56 MHz into a plasma-forming zone and with a source solenoid for forming a magnetic field inside the plasma-forming zone. As a result, a plasma of a helicon mode having a high density can be generated inside the plasma-forming zone and a film of high density can be formed.

Since the high-frequency energy to be applied to the external antenna has a low frequency such as 13.56 MHz, this CVD device obviates the necessity for means such as a waveguide tube capable of generating such an extremely high frequency as 2.45 GHz, which would otherwise be required in the case of the CVD device of the ECR type and consequently enjoys simplicity of construction.

Further, the gas inlet device is provided above the substrate is separated from the first gas inlet device. The reaction gases being supplied onto the substrate, therefore, are prevented from reacting with each other en route to the substrate and formation of particles can be prevented.

DESCRIPTION OF THE PREFERRED EMBODIMENTS

Preferred embodiments of this invention will now be described with reference to the drawings.

Figure 1:
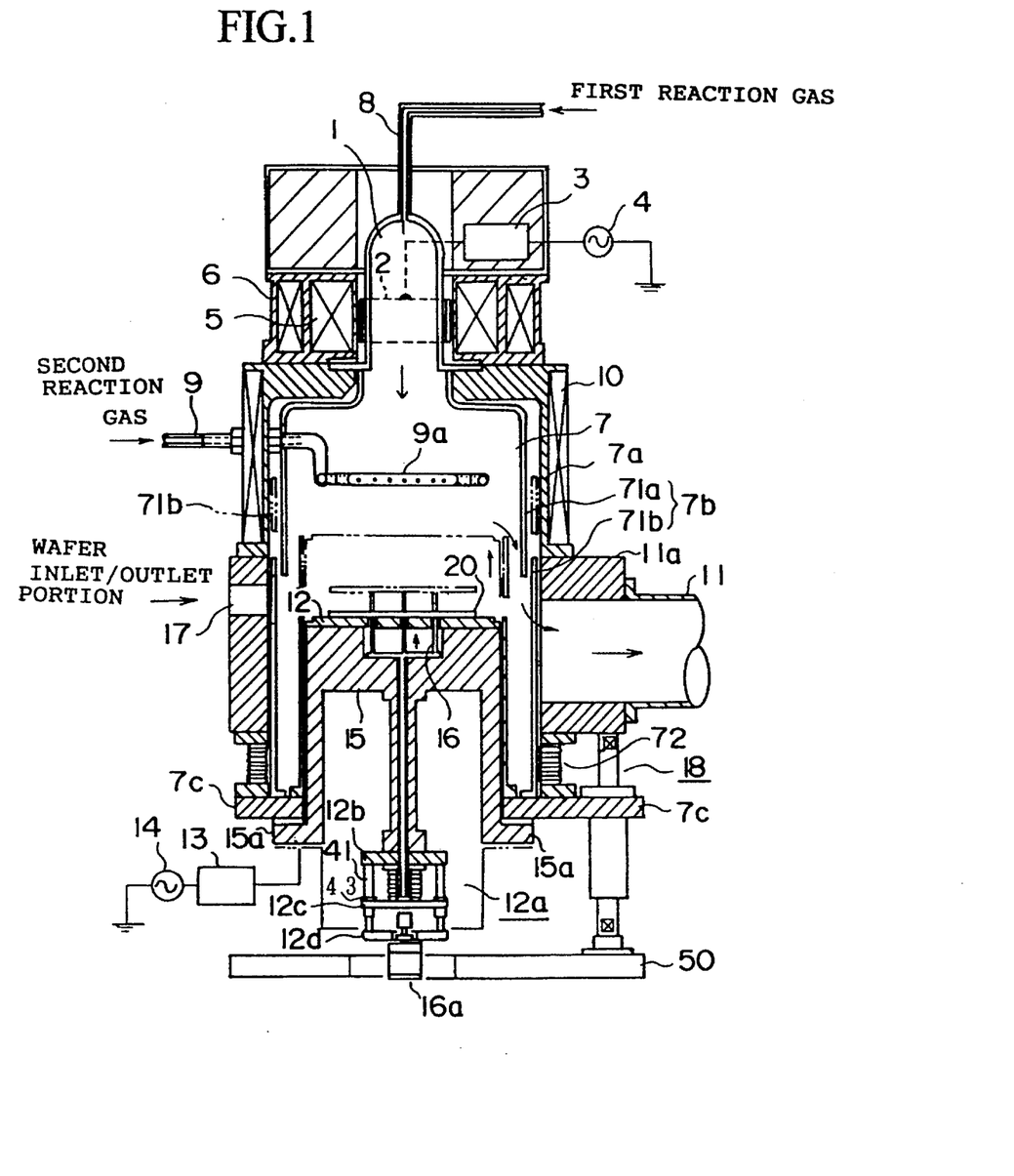
FIG. 1 is an elevational view, in cross-section, of a CVD film-forming apparatus using the helicon mode plasma according to a first embodiment of this invention.

(1) Description of CVD Film-forming Apparatus Using a Helicon Mode Plasma According to a First Embodiment of the Present Invention Referring to FIG. 1, a plasma-forming chamber 1 is isolated from the ambient surroundings by a quartz cylindrical housing 1a, 15 cm across and 25 cm long, and is provided with means to activate a first reaction gas such as, for example, oxygen gas ($O_2$ gas) introduced through a first reaction gas inlet pipe (first gas inlet means) 8.

The shape and location of the first reaction gas inlet pipe 8 inside the plasma-forming chamber 1 may be varied. In the case of this embodiment, the first reaction gas inlet pipe 8 is formed of a slender quartz pipe 6.35 mm in outside diameter and 4 mm in inside diameter and communicates with the upstream central part of the housing of the plasma-forming chamber 1.

Figure 2:
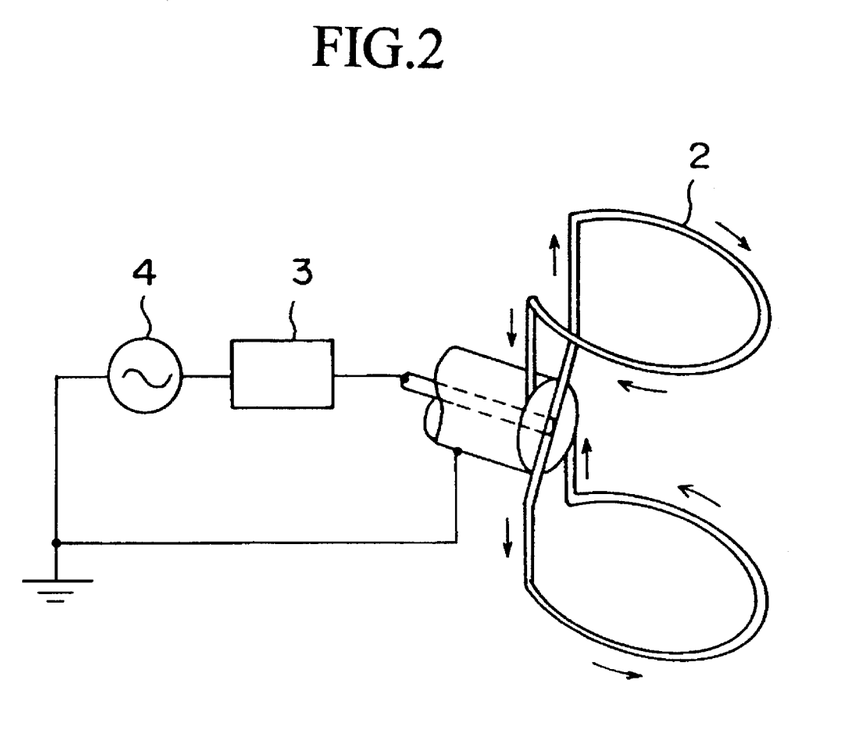
FIG. 2 is a perspective view illustrating in detail an external antenna to be incorporated in the CVD film-forming apparatus using the helicon mode plasma according to the embodiment of FIG. 1.

An external antenna 2 is attached to the periphery of the plasma-forming chamber 1. Two annular conductors, separated by a prescribed distance, are wound around the upper and the lower peripheral portions of the cylindrical plasma-forming chamber 1. The distance between the two annular conductors is important for the purpose of adjusting the number of helicon waves or the density of the plasma. One example of the shape of the external antenna 2 is illustrated in FIG. 2. In the external antenna illustrated in FIG. 2, the RF current is caused to flow in opposite directions through the two annular conductors so as to form a zero mode helicon wave. The helicon wave of a mode of higher order can be formed by varying the shape of the external antenna.

A matching network 3 connects the external antenna 2 to the RF power source 4 for feeding RF electric power of a frequency of 13.56 MHz to the external antenna 2. The RF electric power constitutes an energy source for the formation of plasma.

Figure 3:
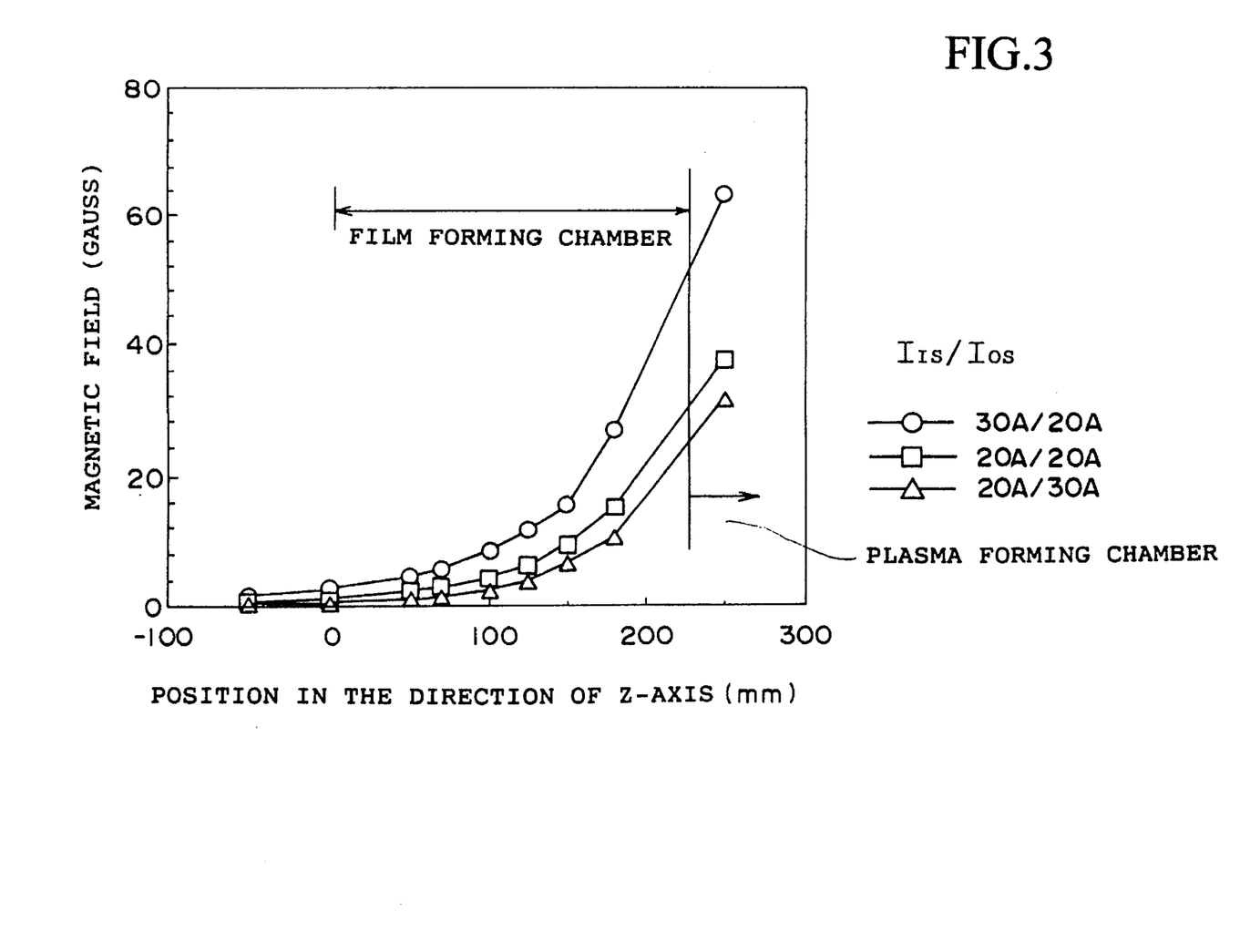
FIG. 3 is a graph showing the relationship between the vertical magnetic field, the solenoid current in the CVD film-forming device using the helicon mode plasma and the Z-axis position in the embodiment of FIG. 1.

A cylindrical inner solenoid 5 is arranged around the plasma-forming chamber 1 and a cylindrical outer source solenoid 6 is provided around the inner source solenoid 5. The inner source solenoid 5 and the outer source solenoid 6 jointly form an axially-extending magnetic field inside the plasma-forming chamber 1. This magnetic field forms a helicon wave and adjusts the plasma density. The relationship between the electric currents passed through the inner solenoid 5 and the outer solenoid 6 and the magnetic field so generated is shown in FIG. 3. In the diagram, $I_{IS}$ stands for the current through the inner solenoid 5 and $I_{OS}$ for the current through the outer solenoid 6.

The plasma-forming chamber 1 and the peripheral devices thereof described above form a plasma of high density, i.e. not less than $10^{12}$ $cm^{-3}$, of the helicon mode. Particularly, the RF electric power, the magnetic field, and the distance between the two annular conductors of the external antenna 2 are important to the formation of the plasma.

A film-forming chamber 7 is isolated from the ambient surroundings by a cylindrical housing 7a measuring 30 cm in inside diameter and 22.5 cm in length and connected to the plasma-forming chamber 1 at its downstream end.

The film-forming chamber 7 is provided with a second reaction gas inlet pipe (second gas inlet means) 9 having a gas discharger 9a for introducing and discharging a second reaction gas. Thus, the helicon mode plasma formed of the first reaction gas in the plasma-forming chamber 1 is supplied to the film-forming chamber 7 and, at the same time, the second reaction gas such as, for example, a TEOS gas, is introduced through the second reaction gas inlet pipe 9 into the film-forming chamber 7. The helicon mode plasma moves toward the downstream side and activates the TEOS gas. As a result, the activated TEOS gas and the oxygen plasma react with each other to deposit a silicon oxide film on a wafer 20.

Figure 6A:
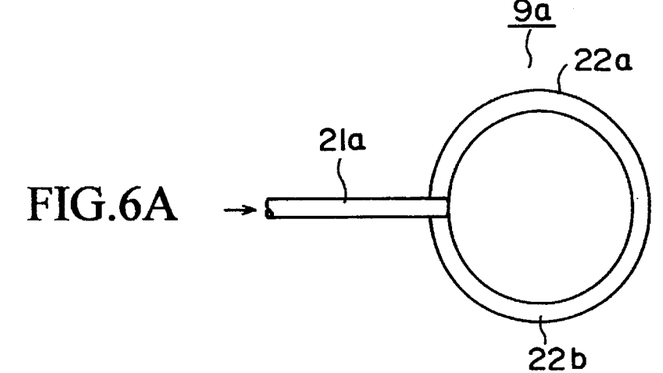
FIG. 6A is a side view showing a second reaction gas inlet pipe incorporated in the CVD film-forming apparatus using the helicon mode plasma according to the first embodiment of the present invention.
Figure 6B:
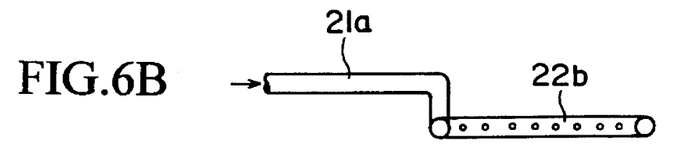
FIG. 6B is a plan view of the inlet pipe shown in FIG. 6A.

The shape and location of the gas discharger 9a of the second reaction gas inlet pipe 9 may be varied. The embodiment which is illustrated in FIG. 6A and FIG. 6B includes a slender quartz pipe (first gas conduit) 21a for guiding the second reaction gas to the film-forming chamber 7 and a gas discharger 9a which branches into two slender quartz pipes (gas discharge pipes) 22a and 22b, each measuring 6.35 mm in outside diameter and 4 mm in inside diameter and joined to each other to form a ring. The interiors of the gas discharge pipes 22a and 22b communicate with each other. Further, the ring of the gas discharger 9a is disposed in a plane parallel to the surface of the wafer 20 which is mounted on a wafer retaining device 12. The plasma flows through the magnetic field and is constricted into a central path by the magnetic field. The plasma, therefore, easily passes through the center of the space enclosed within the ring.

Further, on the inner circumference of the quartz pipes 22a and 22b of the gas discharger 9a, are formed a plurality of spaced gas discharge holes. The second reaction gas is discharged through these gas discharge holes onto the wafer 20. Optionally, these gas discharge holes may be formed along the outer circumference of the ring or along the under side of the ring.

It is, however, undesirable to have these gas discharge holes formed on the upper side of the ring because, if the second reaction gas was discharged upward from the gas discharger, it would be activated by the incoming plasma above the gas discharger and would react with the plasma to form a deposit fast on the gas discharger.

In cases where the reaction product inevitably adheres to the quartz pipes 22a and 22b, these quartz pipes 22a and 22b may be provided with an increased contact area by provision of irregularities on their surfaces so as to prevent the reaction product from peeling off the quartz pipes 22a and 22b and falling onto the wafer 20 below.

The number and the size of the gas discharge holes will vary depending on the type of the second reaction gas to be used. When TEOS is used as the second reaction gas, for example, the holes are formed with larger diameter than when monosilane is used, because the TEOS has higher viscosity than the monosilane.

By separating the oxygen gas inlet pipe 8 and the TEOS gas inlet pipe 9 as described above, the otherwise possible reaction of the two reaction gases is prevented and the possibility of formation of particles is reduced.

The film-forming chamber 7 has a double-wall construction which consists of the housing 7a made of quartz or a metal such as aluminum and a protective wall 7b made of quartz or alumina.

The protective wall 7b is disposed along the inner wall of the housing 7a and is adapted to be removed separately of the housing 7a. It may be replaced, when necessary, with a new protective wall.

The protective wall 7b is separated into an upper protective wall 71a and a lower protective wall 71b which are formed of cylinders, such as quartz, with different diameters. For example, the outside diameter of the upper protective wall 71a is smaller than the inside diameter of the lower protective wall 71b. These two protective walls, therefore, have slightly overlapping portions when the wafer retaining device 12 is lowered to the fullest possible extent and they are set in place. As a result, when the wafer retaining device 12 is vertically moved in conjunction with an RF electrode 15, the protective walls undergo telescoping motion in tandem with the motion of the RF electrode 15. The upper protective wall 71b is fastened to the housing 7a and, therefor, when the housing 7a is vertically moved, this upper protective wall 71a is vertically moved in concert with the vertical motion of the housing 7a. Further, in the protective wall 7b, openings are formed at the positions corresponding to the insertion hole for the second reaction gas inlet pipe 9, a waste gas vent 11, and a wafer inlet/outlet 17 formed in the housing 7a.

The protective wall 7b prevents the product of the reaction between the reaction gases from adhering to the inner wall of the housing 7a. Thus, the reaction product adheres instead to the inner wall of the protective wall 7b.

Washing the protective wall 7b involves exposing the interior of the film-forming chamber 7 to atmospheric pressure, removing the second reaction gas inlet pipe 9, moving the housing 7a upward with a chamber lift 18, taking out the upper protective wall 71a and the lower protective wall 71b, and washing the extracted upper protective wall 71a and lower protective wall 71b to remove the reaction product adhering thereto.

By setting a spare protective wall in the place of the removed protective wall 7b, the formation of a film can be further continued within the CVD device. This measure serves to improve the throughput of the operation and saves in the time and labor and the expense incurred in maintenance because it obviates the necessity for suspending the operation of the CVD device for a long time for the purpose of washing the interior of the film-forming chamber 7.

Optionally, the protective wall 7b, instead of being taken out, may be given an in situ cleaning by introducing an etching gas into the film-forming chamber 7 to remove the adhering reaction product. As a result, the housing 7a is protected from etching. Further, by providing housing 7a around the protective wall 7b and heating in the process of etching, the etching can be accelerated and the effect of the in situ cleaning can be enhanced.

A housing solenoid 10 is a cylindrical permanent magnet, disposed around the film-forming chamber 7, and is adapted to, form a suitable magnetic field within the film-forming chamber 7. The magnetic field guides the plasma from the plasma-forming chamber 1 to the film-forming chamber 7 and confines the flow of the plasma to a central region.

A waste gas vent 11 is provided in the film-forming chamber 7 and is connected to a gas discharge device for discharging excess reaction gas and for lowering the internal pressures of the plasma-forming chamber 1 and the film-forming chamber 7.

A wafer holder 12 (substrate retaining device) is mounted in the lower part of the film-forming chamber 7 and is adapted to mount the wafer 20 thereon. It has an electrostatic chuck for electrostatically fixing the wafer 20, and a heater for heating the wafer 20, both built into a common insulating base. It is vertically moved by a mechanism 12a.

The mechanism 12a for vertically positioning the wafer holder 12 includes a ball screw 41 which supports a supporting plate 12b through the medium of a bearing support (not shown). Ballscrew 41 has a tooth helically threaded around its axis. The ball screw 41 is threaded through ball nut 43 which is provided on a stationary plate 12c. The ball nut 43 has a helically threaded hole by which it engages and supports the ball screw 41. By rotating the ball screw 41 with a stepping motor (not shown), the wafer retaining device 12 is vertically moved through the medium of the supporting plate 12b and the RF electrode 15.

RF electrode 15 is disposed in the lower portion of the wafer holder 12. The RF power source 14 for supplying energy of a frequency of 13.56 MHz or 100 kHz is connected to the RF electrode 14 through the medium of a matching network 13. When energy at a frequency of 13.56 MHz or 100 kHz is applied to the wafer 20, a negative self-bias DC voltage is applied to the wafer 20 so as to optimize qualities of the produced film such as density and stress.

A wafer lift pin 16 is moved by vertical moving means 16a through the RF electrode 15 and the through hole of the wafer retaining device 12 and consequently pushes the wafer 20 upward to separate the wafer 20 from the mounting surface of the wafer holder 12. Then, the wafer 20 so separated is retained on a wafer conveying device (not shown) and removed through the wafer inlet/outlet.

A housing lift 18, standing on floor 50, supports a flange 11a of the waste gas vent 11 and vertically moves the housing 7a of the film forming chamber 7. The housing lift 18 has formed thereon a screw for rotation of the ball screw by engagement of the helically threaded inner wall of the hole in the ball nut. The rotation of the ball screw causes the ball screw to be vertically moved and, through the medium of the flange 11a, further causes the housing 7a to be vertically moved.

As mentioned above, the CVD film-forming apparatus of the present embodiment is provided with an external antenna 2 for applying energy at a frequency of 13.56 MHz inside the plasma-forming chamber 1 and with inner and outer source solenoids 5 and 6 for forming a magnetic field inside the plasma-forming chamber 1. As a result, a helicon mode plasma of high density is formed in the plasma-forming chamber 1 and a film of high density is consequently formed.

Since the high-frequency electric power applied to the external antenna 2 has a low frequency, such as 13.56 MHz, the present apparatus obviates the necessity for means such as a waveguide tube, capable of generating an extremely high frequency such as 2.45 GHz, which would be otherwise required in the case of a CVD device of the ECR type, and consequently enjoys simplicity of construction.

The second reaction gas inlet pipe 9 is provided above the wafer 20 and is separated from the first reaction gas inlet pipe 8. The reaction gases are directed onto the wafer 20 and, therefore, the possibility of particle formation is reduced.

Further, the reaction gases are uniformly supplied onto the wafer 20 because the gas discharger 9a of the second reaction gas inlet pipe 9 is disposed above the wafer 20. As a result, the uniformity of the film thickness is improved.

The plasma is formed with high efficiency because the first reaction gas inlet pipe 8 communicates with the chamber upstream of the plasma-forming chamber 1.

Figure 4:
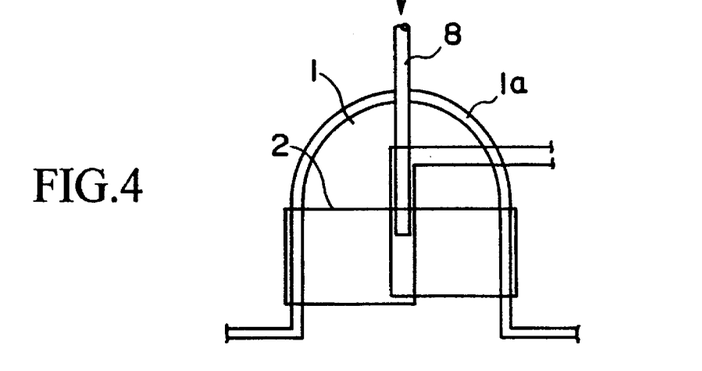
FIG. 4 is a perspective view showing a first reaction gas inlet pipe incorporated in the CVD film-forming apparatus using a helicon mode plasma according to a second embodiment of the present invention.

(2) The Gas Inlet Devices of the Second Through the Sixth Embodiments (A) First Reaction Gas Inlet Pipe for Introducing and Discharging the Gas Converted into Plasma (a) Second Embodiment As illustrated in FIG. 4, the first reaction gas inlet pipe (first gas inlet means) 8 for introducing the first reaction gas into the plasma-forming chamber 1 is formed of a slender quartz pipe having an end part serving as a gas discharger and measuring 6.35 mm in outside diameter and 4 mm in inside diameter. Inlet pipe 8 connects with the center of chamber 1 on the upstream side of the housing 1a of the plasma-forming chamber 1.

When the first reaction gas is introduced into the first reaction gas inlet pipe 8, it is directly discharged into the central part of the plasma-forming chamber 1. At this time, the external antenna 2 radiates high frequency wave energy, the solenoid coils 5 and 6 apply a magnetic field and, as a result, the first reaction gas is converted into a plasma under the influence of the energy from the resultant electromagnetic field.

The electric field and the magnetic field are symmetrical relative to the central axis. By introducing the first reaction gas to the central part of the plasma-forming chamber 1, therefore, it is efficiently converted into a plasma and the efficiency of plasma formation is improved.

The first reaction gas which has been converted into the plasma flows downstream and activates the second reaction gas which has been discharged into the film-forming chamber 7.

(b) Third Embodiment

Figure 5A:
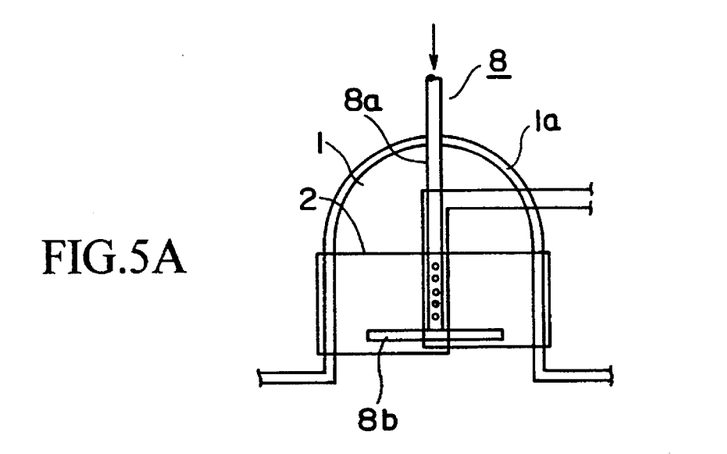
FIG. 5A is a side view showing a first reaction gas inlet pipe incorporated in the CVD film-forming apparatus using a helicon mode plasma according to a third embodiment of the present invention.
Figure 5B:
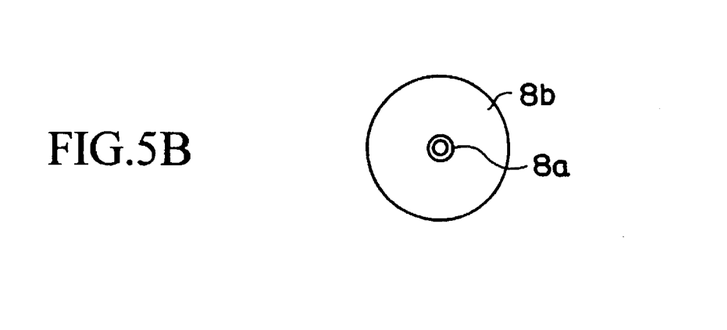
FIG. 5B is a plan view of the inlet pipe of the third embodiment.

As illustrated in FIG. 5A and FIG. 5B, the first reaction gas inlet pipe (first gas discharge means) 8 for introducing the first reaction gas and discharging it into the plasma-forming chamber 1 comprises a gas conduit (gas discharge pipe) 8a which guides the first reaction gas and which is provided with a plurality of gas discharge holes bored through the pipe wall. A relay plate 8b is attached to the distal end of the gas conduit 8a with the axis of the conduit perpendicular to the plate surface. The plate 8b receives the first reaction gas discharged through the gas discharge holes and redirects the first reaction gas over its edge in the downstream direction.

Part of the discharged first reaction gas is converted into a plasma and the remainder thereof flows downstream. The first reaction gas thus moving downward is intercepted by the relay plate 8b and then caused to spread out on the surface of the relay plate 8b toward its periphery. At the same time, the external antenna 2 radiates wave energy and the solenoid coils 5 and 6 apply a magnetic field and, as a result, the first reaction gas is converted into a plasma under the influence of the energy of the resultant electromagnetic field. Since the plate 8b increases the travel distance of the reaction gas, substantially all the reaction gas is converted into the plasma.

Further, the gas which has been converted into the plasma flows over the edge of the plate surface in the downstream direction and activates the second reaction gas which has been introduced into the film-forming chamber 7.

The first reaction gas inlet pipe according to the third embodiment of this invention can accelerate the conversion into the plasma because it lengthens the travel distance of the reaction gas by using the relay plate 8b to intercept the flow of the first reaction gas discharged from the gas conduit 8a and spread this flow over the surface thereof as described above. The efficiency of plasma formation, therefore, is improved.

(B) Second Reaction Gas Inlet Pipe for Introducing the Second Reaction Gas and Discharging it into the Film-forming Chamber The second and the third embodiments described above represent the cases related to the first reaction gas inlet pipe 8 whereas the fourth and the fifth embodiments now to be described relate to the second reaction gas inlet pipe 9.

(a) Fourth Embodiment

Figure 7A:
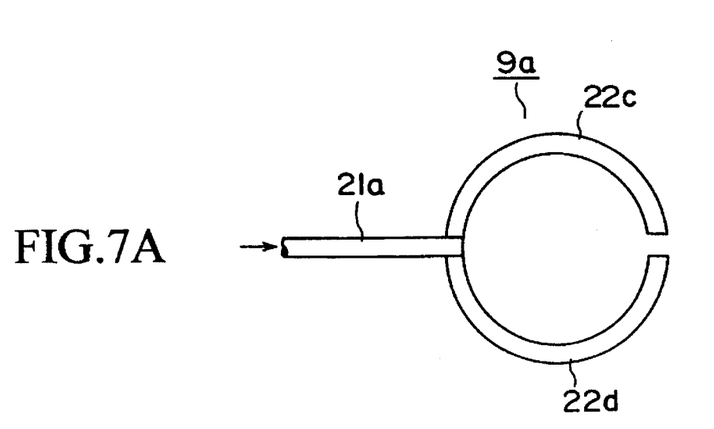
FIG. 7A is a side view of a second reaction gas inlet pipe to be incorporated in the CVD film-forming apparatus using a helicon mode plasma according to a fourth embodiment of the present invention.
Figure 7B:
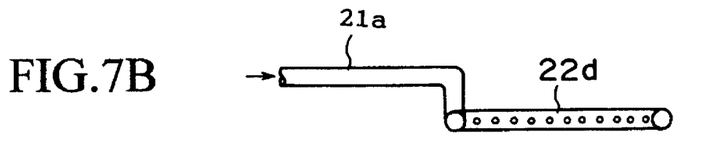
FIG. 7B is a plan view of the inlet pipe of FIG. 7A.

As illustrated in FIG. 7A and FIG. 7B, the second reaction gas inlet pipe (second gas inlet means) 9 for introducing the reaction gas and discharging it into the film-forming chamber 7 comprises a first gas conduit 21a for guiding the reaction gas and two gas discharge pipes 22c and 22d communicating with the first gas conduit 21a and branching from the first gas conduit 21a. The two gas conduits 22c and 22d meet each other to form a ring. A plurality of gas discharging holes are bored through the pipe wall around the inner circumference of the ring.

The ring which consists of the gas discharge pipes 22c and 22d is disposed above the wafer 20 in a plane which is parallel to the surface of the wafer 20.

Through the gas discharge holes in the second reaction gas inlet pipe, the second reaction gas is discharged onto the wafer 20 which is mounted on the wafer holder 12. The second reaction gas thus discharged is converted into the plasma, activated by the first reaction gas flowing downstream, and caused to react with the first reaction gas. As a result, an insulating film of the reaction product is formed on the wafer 20.

Thus, the second reaction gas inlet pipe in the film-forming apparatus of the fourth embodiment produces the same effect as the second reaction gas inlet pipe 9 in the first embodiment.

(b) Fifth and Sixth Embodiments

Figure 8A:
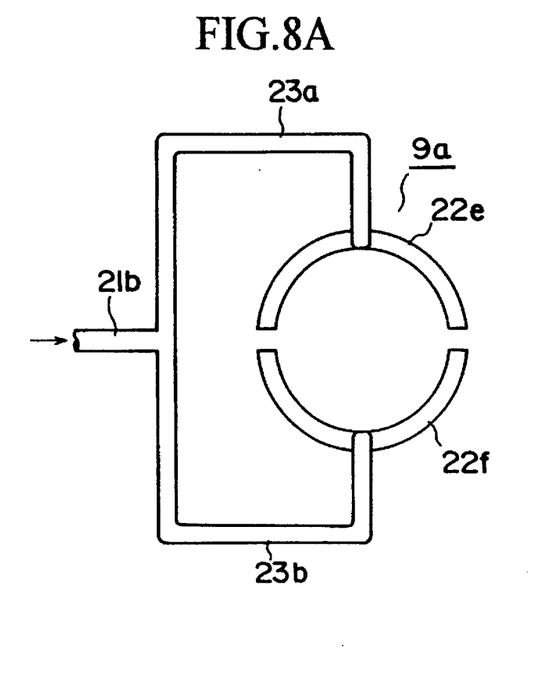
FIG. 8A is a side view of a second reaction gas inlet pipe to be incorporated in the CVD film-forming apparatus using a helicon mode plasma according to a fifth embodiment of the present invention.
Figure 8B:
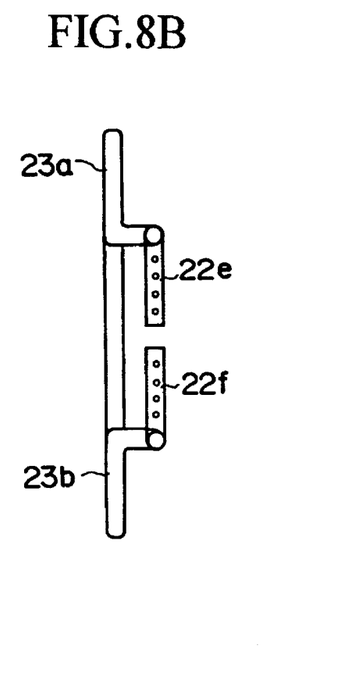
FIG. 8B is a plan view of the inlet pipe shown in FIG. 8A.

As illustrated in FIG. 8A and FIG. 8B, the second reaction gas inlet pipe (second gas discharge means) 9 comprises a first gas conduit 21b for guiding the reaction gas, a second gas conduit consisting of two second gas conduits 23a and 23b communicating with the first gas conduit 21b and branching from the first gas conduit 21b, and two gas discharge pipes 22e and 22f communicating, respectively, with the second gas conduits 23a and 23b. The gas discharge pipes 22e and 22f are formed into the shape of a ring.

The gas discharge pipes 22e and 22f have a plurality of gas discharge holes bored along their inner or outer circumference.

The ring formed of the gas discharge pipes 22e and 22f is disposed above the wafer 20 in a plane which is parallel to the surface of the wafer 20.

Through the gas discharge holes in the second reaction gas inlet pipe 9, the reaction gas is discharged onto the wafer 20 which is mounted on the wafer holder 12. The second reaction gas thus discharged is converted into the plasma, activated by the first reaction gas flowing toward the downstream side, and caused to react with the first reaction gas. As a result, an insulating film of the reaction product is formed on the wafer 20.

Owing to the mechanism described above, the second reaction gas inlet pipe in the film-forming apparatus of the fifth embodiment produces the same effect as the second reaction gas inlet pipe 9 described in the first embodiment.

Figure 9A:
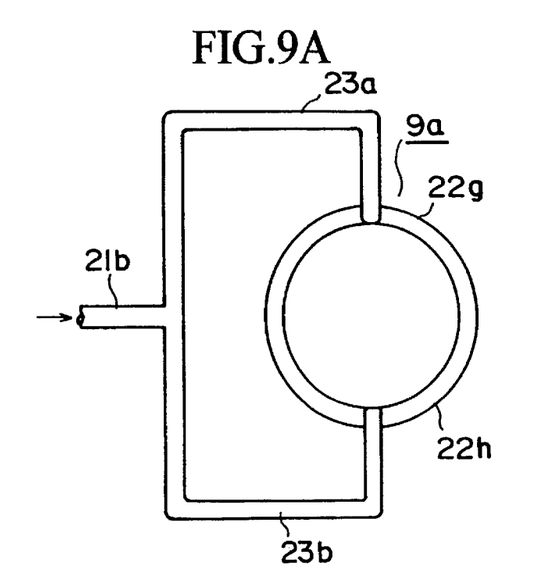
FIG. 9A is a side view of a second reaction gas inlet pipe to be incorporated in the CVD film-forming apparatus using a helicon mode plasma according to a sixth embodiment of the present invention.
Figure 9B:
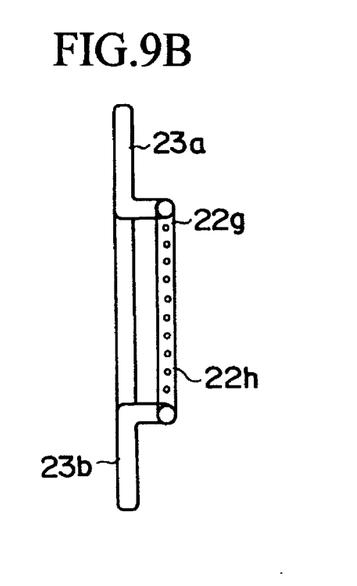
FIG. 9B is a plan view of the inlet pipe of FIG. 9A.

In the fifth embodiment, the gas discharge pipe forming the gas discharge portion 9a is divided into two separate gas discharge pipes 22e and 22f. Optionally, as in the sixth embodiment illustrated in FIG. 9A and FIG. 9B, two separate gas discharge pipes 22g and 22h may be joined at the respective ends thereof to form a ring in which the interiors thereof communicate with each other.

In the fourth through the sixth embodiments, the gas discharge holes are provided along the inner circumference of the ring of the gas conduits of the gas discharge portion 9a. Optionally, they may be 25 formed along the outer circumference of the ring or on the lower part of the ring.

(3) Description of the Method for the Formation of Film by the CVD Technique Using the Helicon Mode Plasma The method for forming a silicon oxide film using the CVD film-forming apparatus illustrated in FIG. 1 will now be described. $O_2$ and TEOS (Ar) gas are used as the reaction gases. The TEOS (Ar) gas is obtained by using Ar gas as a carrier gas and bubbling this carrier gas through a TEOS solution at normal room temperature. TEOS is the acronym for tetraethoxy silane [$Si(OC_2H_5)_4$; $(SiO_4C_8H_{20})$].

The conditions for the formation of the film are as follows:

(a) Flow rate ratio of $O_2$/TEOS (Ar) (standard value=3), (b) Total flow rate of reaction gases ($O_2$=1.31 SLM, TEOS (Ar)=0.44 SLM, standard value=1.75 SLM), (c) Gas pressure (standard value=0.2 Torr), (d) Substrate temperature (standard value=350° C.), (e) Wafer position (the lower end of the film forming chamber 7 taken as 0; standard value=+45 mm), (f) RF power applied to the external antenna 2 (standard value=1.5 kW), (g) Electric current through the inner solenoid (standard value=60 A), and (h) Electric current through the outer solenoid (standard value=60 A).

$O_2$ and $SiH_4$ gas may be used instead as the reaction gases. In this case, the conditions for the formation of the film are, for example, as follows:

(a) Flow rate ratio of $O_2$/$SiH_4$ (standard value=1), (b) Individual flow rates of reaction gases and total flow rate of gases (standard value of flow rate of $O_2$ gas=30 SCCM, standard value of flow rate of $SiH_4$ gas=30 SCCM, and standard value of total flow rate of gases= 60 SCCM), (c) Gas pressure (standard value=20 mTorr), (e) Wafer position (bottom of the film-forming chamber 7 taken as 0; standard value=161 mm), (f) Substrate bias [$P_B$] (standard value of frequency–100 kHz and standard value of electric power=200 W), (g) RF power applied to the external antenna 2 [$P_{RF}$] (standard value of frequency=13.56 MHa and standard value of electric power=1.0 kw), (h) Electric current through inner solenoid [$I_{IS}$] (standard value=50 A), and (i) Electric current through outer solenoid [$I_{OS}$] (standard value=60 A).

First, the wafer 20 is mounted on the wafer holder 12 and fixed thereto with the electrostatic chuck. Thereafter, the plasma-forming 10 chamber 1 and the film-forming chamber 7 are evacuated with a turbo-molecular pump and then retained at a vacuum with a pressure of not more than $10^{-3}$ Torr.

Then, the wafer holder 12 supporting the wafer 20 thereon is moved upward and set at the prescribed position in the film-forming chamber 7. Subsequently, the wafer 20 is heated to and retained at the prescribed temperature by means of an heater (not shown) built into the wafer holder 12.

The $O_2$ gas is now introduced at the prescribed flow rate via the first reaction gas inlet pipe 8 into the plasma-forming chamber 1 and the TEOS (Ar) gas or the $SiH_4$ gas is introduced at the prescribed flow rate via the second reaction gas inlet pipe 9 into the film-forming chamber 7. Subsequently, the gas pressure inside the film-forming chamber 7 is adjusted to and retained at the prescribed magnitude.

Then, electric currents of the prescribed magnitudes are supplied to the inner and the outer solenoids 5 and 6 to induce generation of a magnetic field and, at the same time, RF energy of the prescribed magnitude is applied to the external antenna 2 via the matching network 3. As a result, the $O_2$ gas is activated to generate a helicon mode plasma. This helicon mode plasma flows into the film-forming chamber 7 and serves to activate the TEOS gas therein. Then, the activated TEOS gas and the oxygen plasma react with each other to commence the deposition of a silicon oxide film on the wafer 20 at a prescribed deposition rate.

The silicon oxide film is grown on the wafer 20 to the prescribed thickness by allowing the film-forming apparatus to remain in the ensuant condition for the prescribed length of time.

The method for film formation according to the embodiment of this invention effects generation of a helicon mode plasma of the first reaction gas by the cooperation of the high-frequency electricity at a frequency of 13.56 MHz and the magnetic field and attains the formation of the film on the substrate by the reaction of this plasma with the second reaction gas activated by the plasma as described above. The produced film enjoys improved density of texture because the helicon mode plasma has a high density.

In the film-forming apparatus according to this invention, the plasma is formed with high efficiency because the first gas inlet communicates with the central part of the housing of the plasma-forming chamber on the upstream side thereof or is disposed in the central part of the plasma-forming chamber as described above.

Further, the efficiency of the plasma formation is improved by the fact that the retention time of the first reaction gas in the plasma-forming part is prolonged by causing the relay plate to intercept the incoming first reaction gas and spread it out over the surface thereof.

The uniformity of the thickness of the produced film is improved because the gas discharger of the gas inlet device is disposed above the substrate and, as a result, the reaction gases are uniformly supplied onto the substrate.

Since the gas discharger is formed in an annular shape, it permits easy passage therethrough of the plasma which flows in from the upstream side of the film-forming apparatus.

Because the CVD device is provided with an external antenna for radiating high frequency wave energy, i.e. a frequency of 13.56 MHz, into the plasma-forming area of the apparatus and with a source solenoid for forming a magnetic field inside the plasma-forming area, the helicon plasma of high density is generated inside apparatus and a film of high density texture can be formed.

Since the electric power applied to the external antenna has a low frequency such as 13.56 MHz, this CVD device obviates the necessity for means such as a waveguide tube capable of generating an extremely high frequency at 2.45 GHz, otherwise required in the case of the CVD device of the ECR type, and consequently enjoys simplicity of construction.

Further, the second gas inlet is provided above the substrate separately from the first gas inlet. The reaction gases supplied onto the wafer 20, therefore, can be prevented from reaction and the formation of particles can consequently be reduced.

Besides, the combination of oxygen and TEOS, or oxygen and $SiH_4$, used as a combination of a first and second reaction gas in the above embodiment, another combination, for example, that of ammonia and $SiH_4$ or the like can be used.

Further, though the first gas discharge means 8 is described as discharging oxygen as a first reaction gas and the second gas discharge means 9 is described as discharging TEOS or $SiH_4$ as a second reaction gas in the above embodiment, the first gas discharge means 8 may discharge an inert gas, for example, argon or the like as a activation-assisting gas, and the second gas discharge means 9 may discharge TEOS and oxygen or the like as a reaction gas.

What is claimed is:

1. A film-forming apparatus for forming a film on a substrate comprising:

a housing having a central axis and an interior defining an upstream plasma-forming chamber and a downstream film-forming chamber open to said plasma-forming chamber;

a substrate holder for supporting the substrate within said film-forming chamber;

means for forming a plasma from a first reaction gas within a plasma-forming zone extending along said central axis within said plasma-forming chamber;

first gas inlet means for introducing the first reaction gas into an upstream end of said plasma-forming chamber, said first gas inlet means comprising a gas pipe terminating at a distal end within said plasma-forming chamber and having a plurality of gas discharge holes for discharge of the first reaction gas into said plasma-forming chamber and a plate fixed to said distal end and having an upstream surface for receiving the first reaction gas discharged from said gas discharge holes, whereby the first reaction gas is discharged into said plasma-forming zone, flows toward said downstream film-forming chamber, then impacts said upstream surface of said plate, then flows over said upstream surface radially outward from said central axis and then exits said plasma-forming chamber and flows into said film-forming chamber;

second gas inlet means for introducing a second reaction gas into said film-forming chamber for reaction with said first reaction gas to deposit a reaction product as a film on the substrate.

2. The film-forming apparatus according to claim 1 wherein said upstream surface is a planar surface perpendicular to said central axis.

3. The film-forming apparatus according to claim 1 wherein said plasma-forming chamber and said film-forming chamber are axially aligned on said central axis and wherein said film-forming chamber has a diameter larger than the diameter of said plasma-forming chamber.

4. The film-forming apparatus according to claim 1, wherein said second gas inlet means comprises gas discharge pipes disposed above said substrate and formed in an annular shape in a plane parallel to the surface of said substrate.

5. The film-forming apparatus according to claim 4, wherein said second gas inlet means further comprises a first gas conduit for communicating with the gas discharge pipes so as to guide said second reaction gas thereto.

6. The film-forming apparatus according to claim 4, wherein said second gas inlet means comprises a first gas conduit for guiding said second reaction gas, and a plurality of second gas conduits branching from said first gas conduit and communicating with said gas discharge pipes.

7. The film-forming apparatus according to claim 1, further comprising:

an antenna for irradiating said plasma-forming zone with RF energy; and a solenoid coil for generating a magnetic field inside said plasma-forming zone, whereby said RF energy and said magnetic field cooperate to convert said first reaction gas into a helicon mode plasma.

8. The film-forming apparatus according to claim 7, wherein said RF energy has a frequency of 13.56 MHz.

9. The film-forming apparatus according to claim 1, wherein said first gas inlet means is provided with a gas discharge opening disposed in a central area of said plasma-forming zone.

10. A film-forming apparatus for forming a film on a substrate comprising:

a housing having a central axis and an interior defining an upstream plasma-forming chamber and a downstream film-forming chamber open to said plasma-forming chamber;

a substrate holder for supporting the substrate within said film-forming chamber;

means for forming a plasma from a first reaction gas within a plasma-forming zone extending along said central axis within said plasma-forming chamber;

first gas inlet means for introducing the first reaction gas into an upstream end of said plasma-forming chamber, said first gas inlet means comprising a gas pipe terminating at a distal end within said plasma-forming chamber and having a plurality of gas discharge holes for discharge of the first reaction gas into said plasma-forming chamber and a plate fixed to said distal end and having an upstream surface for receiving the first reaction gas discharged from said gas discharge holes, whereby the first reaction gas is discharged into said plasma-forming zone, flows toward said downstream film forming chamber, then impacts said upstream surface of said plate, then flows over said upstream surface radially outward from said central axis and then exits said plasma-forming chamber and flows into said film-forming chamber;

second gas inlet means for introducing a second reaction gas into said film-forming chamber for reaction with said first reaction gas to deposit a reaction product as a film on the substrate, said second gas inlet means comprising a plurality of gas discharge pipes, each of said gas discharge pipes having a plurality of gas discharge holes for discharge of the second reaction gas into said film-forming chamber.

11. The film-forming apparatus according to claim 10 wherein said upstream surface is a planar surface perpendicular to said central axis.

12. The film-forming apparatus according to claim 10 wherein said plasma-forming chamber and said film-forming chamber are axially aligned on said central axis and wherein said film-forming chamber has a diameter larger than the diameter of said plasma-forming chamber.

13. The film-forming apparatus according to claim 10, wherein said gas discharge pipes are disposed above said substrate and are formed in an annular shape in a plane parallel to the surface of said substrate.

14. The film-forming apparatus according to claim 13, wherein said second gas inlet means further comprises a first gas conduit communicating with said gas discharge pipes so as to guide the second reaction gas thereto.

15. The film-forming apparatus according to claim 13, wherein said second gas inlet means further comprises a first gas conduit for guiding said reaction gas, and a plurality of second gas conduits branching from said first gas conduit and communicating with said gas discharge pipes.

16. The film-forming apparatus according to claim 10, further comprising:

an antenna for irradiating said plasma-forming zone with RF energy; and a solenoid coil for generating a magnetic field inside said plasma-forming zone, whereby said RF wave energy and said magnetic field cooperate to convert said first reaction gas into said helicon mode plasma.

17. The film-forming apparatus according to claim 14, wherein said RF wave energy has a frequency of 13.56 MHz.

18. The film-forming apparatus according to claim 10, wherein said first gas inlet means is provided with a gas discharge opening disposed in a central area of said plasma-forming chamber.

* * * * *

UNITED STATES PATENT AND TRADEMARK OFFICE
CERTIFICATE OF CORRECTION

PATENT NO. : 5,620,523
DATED : April 15, 1997
INVENTOR(S) : MAEDA et al

It is certified that error appears in the above-indentified patent and that said Letters Patent is hereby corrected as shown below:

Col. 9, line 58, "60" should read --50--.

Col. 14, line 18, "14" should read --16--.

Signed and Sealed this

Thirty-first Day of March, 1998

*Attest:*

BRUCE LEHMAN

*Attesting Officer*   *Commissioner of Patents and Trademarks*